United States Patent
Dutta et al.

(10) Patent No.: US 10,886,462 B2
(45) Date of Patent: Jan. 5, 2021

(54) ENCAPSULATED MEMORY PILLARS

(71) Applicant: International Business Machines Corporation, Armonk, NY (US)

(72) Inventors: Ashim Dutta, Menands, NY (US); Ekmini Anuja de Silva, Singerlands, NY (US); Jennifer Church, Troy, NY (US); Luciana Meli Thompson, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/194,443

(22) Filed: Nov. 19, 2018

(65) Prior Publication Data

US 2020/0161540 A1    May 21, 2020

(51) Int. Cl.
*H01L 43/12* (2006.01)
*H01L 43/02* (2006.01)
*H01L 27/22* (2006.01)
*H01L 21/02* (2006.01)

(52) U.S. Cl.
CPC .......... *H01L 43/12* (2013.01); *H01L 21/0217* (2013.01); *H01L 21/02126* (2013.01); *H01L 27/222* (2013.01); *H01L 43/02* (2013.01); *H01L 21/0228* (2013.01); *H01L 21/02271* (2013.01); *H01L 21/02274* (2013.01)

(58) Field of Classification Search
CPC ....................................................... H01L 43/12
See application file for complete search history.

(56) References Cited

U.S. PATENT DOCUMENTS

| | | | |
|---|---|---|---|
| 7,833,808 B2 | 11/2010 | Xu et al. | |
| 8,835,256 B1 * | 9/2014 | DeBrosse | H01L 29/66787 438/268 |
| 8,835,325 B2 | 9/2014 | Haiyang et al. | |
| 9,660,179 B1 | 5/2017 | Annunziata et al. | |
| 9,754,779 B1 | 11/2017 | Ishikawa et al. | |
| 9,911,591 B2 | 3/2018 | Thompson et al. | |
| 2014/0021570 A1 * | 1/2014 | Chen | G11C 11/16 257/422 |

(Continued)

OTHER PUBLICATIONS

Caro et al., "Selective self-assembled monolayer coating to enable Cu-to-Cu connection in dual damascene vias," Microelectronic Engineering, 106 (2013), p. 76-80.

*Primary Examiner* — Moazzam Hossain
(74) *Attorney, Agent, or Firm* — Cantor Colburn LLP; Daniel Morris

(57) ABSTRACT

A method for selectively encapsulating embedded memory pillars in a semiconductor device includes coating a passivation layer on a first dielectric surface on a first outer dielectric layer present in the semiconductor device. The passivation layer adheres to the dielectric surface selective to metal. The method includes depositing an encapsulation layer on side and top surfaces of the embedded memory pillars. The passivation layer prevents deposition of the encapsulation layer on the first dielectric surface of the first outer layer dielectric. The method includes removing the first outer dielectric layer from horizontal subraces around the embedded memory pillar and the encapsulation layer from the top surface of the embedded memory pillars.

10 Claims, 2 Drawing Sheets

(56) References Cited

U.S. PATENT DOCUMENTS

| | | | |
|---|---|---|---|
| 2015/0262864 A1* | 9/2015 | Okamoto | H01L 21/31144 |
| | | | 438/671 |
| 2016/0079521 A1* | 3/2016 | Draeger | H01L 43/12 |
| | | | 438/3 |
| 2017/0222136 A1* | 8/2017 | Annunziata | H01L 27/224 |
| 2017/0301857 A1* | 10/2017 | Mudivarthi | H01L 43/12 |
| 2017/0316940 A1 | 11/2017 | Ishikawa | |
| 2017/0342553 A1 | 11/2017 | Yu | |
| 2018/0012752 A1 | 1/2018 | Tapily | |
| 2018/0286694 A1* | 10/2018 | Wang | H01L 21/76819 |
| 2019/0027679 A1* | 1/2019 | Ouellette | H01L 27/222 |
| 2019/0122982 A1* | 4/2019 | Hourani | H01L 21/76831 |
| 2019/0198343 A1* | 6/2019 | Hsieh | H01L 43/08 |
| 2019/0355675 A1* | 11/2019 | Lee | H01F 41/14 |
| 2020/0243757 A1* | 7/2020 | Vasquez | H01F 10/329 |

\* cited by examiner

ENCAPSULATED MEMORY PILLARS

BACKGROUND

The present invention generally relates to fabrication methods and resulting structures for semiconductor devices. More specifically, the present invention relates to encapsulated memory pillars in a semiconductor device.

Integrated circuits (ICs) are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts and other structures that couple to active regions (e.g., gate/source/drain) of the FEOL device elements. Layers of interconnections are formed above these logical and functional layers during the BEOL stage to complete the IC.

Memory structures such as magnetic tunnel junction (MTJ) stacks can be embedded in BEOL interconnect structures. The MTJ stack is a two-terminal device that can be part of an MTJ pillar that includes the MTJ stack, a cap formed on the MTJ stack, and a conductive hardmask formed over the cap. The MTJ pillar can be electrically accessed through a top contact coupled to the conductive hardmask, and a bottom contact coupled to the bottom of the MTJ stack.

SUMMARY

Embodiments of the present invention are directed to a method for selectively encapsulating embedded memory pillars in a semiconductor device. A non-limiting example of the method includes coating a passivation layer on a first dielectric surface on a first outer dielectric layer present in the semiconductor device. The passivation layer adheres to the dielectric surface selective to metal. The method includes depositing an encapsulation layer on side and top surfaces of the embedded memory pillars. The passivation layer prevents deposition of the encapsulation layer on the first dielectric surface of the first outer layer dielectric. The method includes removing the first outer dielectric layer from horizontal subraces around the embedded memory pillar and the encapsulation layer from the top surface of the embedded memory pillars.

Embodiments of the invention are directed to a semiconductor device. The semiconductor device includes a substrate, at least two dielectric layers on the substrate, and embedded memory pillars. The embedded memory pillars are disposed on a dielectric layer. The embedded memory pillars include an encapsulation layer on at least two sides of the embedded memory pillars.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
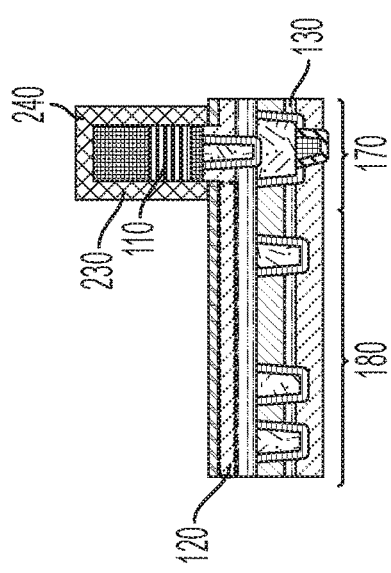
FIG. 1 depicts a semiconductor device after a set of initial fabrication operations according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, with the growth of digital data applications, there is a need for increasingly fast and scalable memory technologies for data storage and data-driven computation. Electronic memory can be classified as volatile or non-volatile. Volatile memory retains its stored data only when power is supplied to the memory, but non-volatile memory retains its stored data without constant power. Volatile random access memory (RAM) provides fast read/write speeds and easy re-write capability. However, when system power is switched off, any information not copied from volatile RAM to a hard drive is lost. Although non-volatile memory does not require constant power to retain its stored data, it in general has lower read/write speeds and a relatively limited lifetime in comparison to volatile memory.

Magnetoresistive random access memory (MRAM) is a non-volatile memory that combines a magnetic device with standard silicon-based microelectronics to achieve the combined attributes of non-volatility, high-speed read/write operations, high read/write endurance and data retention. The term "magnetoresistance" describes the effect whereby a change to certain magnetic states of the MTJ storage element (or "bit") results in a change to the MTJ resistance, hence the name "Magnetoresistive" RAM. A basic MTJ stack includes a free layer and a fixed/reference layer, each of which includes a magnetic material layer. The free and reference layers are separated by a non-magnetic insulating tunnel barrier. The free layer and the reference layer are magnetically de-coupled by the tunnel barrier. The free layer has a variable magnetization direction, and the reference layer has an invariable magnetization direction.

An MTJ stack stores information by switching the magnetization state of the free layer. When the free layer's magnetization direction is parallel to the reference layer's magnetization direction, the MTJ is in a low resistance state. Conversely, when the free layer's magnetization direction is anti-parallel to the reference layer's magnetization direction, the MTJ is in a high resistance state. The difference in resistance of the MTJ can be used to indicate a logical "1" or "0," thereby storing a bit of information. The tunneling magnetoresistance (TMR or MR) of an MTJ determines the difference in resistance between the high and low resistance states. A relatively high difference between the high and low resistance states facilitates read operations in the MRAM.

An MTJ stores information by switching the magnetization state of the magnetic free layer. When the magnetization direction of the magnetic free layer is parallel to the magnetization direction of the reference layer, the MTJ is in a "low resistance" state. Conversely, when the magnetization direction of the free layer is antiparallel to the magnetization direction of the reference layer, the MTJ is in a "high resistance" state. The TMR of an MTJ determines the difference in resistance between the high and low resistance states. In general, the TMR of an MTJ is defined as (RAP−RP)/RP where RP and RAP are the resistance of the MTJ for parallel and anti-parallel alignment of the ferromagnetic layers, respectively. A relatively high difference between the high and low resistance states facilitates read operations in the MRAM. The difference in resistance of these two states of the MTJ is used to indicate a logical '1' or '0', thereby storing a bit of information. The tunneling current is typically higher when the magnetic moments of the two ferromagnetic layers are parallel and lower when the magnetic moments of the two ferromagnetic layers are anti-parallel.

When fabricating MRAM devices, the MTJ structures are typically encapsulated in a layer of insulating/dielectric material, and conductive contacts are formed in the encapsulating layer of insulating/dielectric material to make electrical connections to and between the MTJ structures in an MRAM array. Conventional processes and materials that are used for encapsulating the MTJ structures and patterning the encapsulating material to form contact openings to the MTJ structures, can cause a signification degradation in the electrical and/or magnetic performance of the MTJ structures.

For example, after the ion beam etching and subsequent encapsulation of the embedded memory and logic area, damaged dielectric material needs to be removed from horizontal surfaces without recessing the encapsulation layer on vertical sidewalls of MTJ pillars to the extent that the tunnel junction is exposed. This can be difficult to achieve because the encapsulation is recessed around the MTJ pillar sidewalls exposing the tunnel junction when removing the damaged dielectric during conventional dielectric removal process. The selected dielectric material therefore needs to be such that it can be removed selective to encapsulation and the underlying dielectric material, which poses a significant limitation to the dielectric materials that can be used.

Turning now to an overview of the aspects of the invention, one or more embodiments of the invention address the above-described shortcomings of the prior art by providing a method of selectively encapsulating embedded memory pillars and resulting structures in a semiconductor device. In embodiments of the invention, selective encapsulation of embedded memory pillars is achieved, allowing removal of damaged dielectric material around the embedded memory pillars while controlling the amount of recess of the encapsulation layer on the memory pillar sidewall even with a dielectric removal process having low selectivity to the encapsulation layer material. Selective deposition of the encapsulation layer can be enabled with a self-assembled monolayer (SAM) that can be coated on an oxide surface selective to metal or on a nitride surface selective to metal or any other dielectric materials (e.g., SiCN(H), SiCOH etc.) to metal (e.g., an MTJ stack pillar).

In embodiments of the invention, methods for selectively encapsulating embedded memory pillars in a semiconductor device can include coating a passivation layer on a first dielectric surface present in the semiconductor device. The passivation layer adheres to the dielectric surface selective to metal. After coating the passivation layer, an encapsulation layer can be deposited on side and top surfaces of the embedded memory pillars. The passivation layer can be configured to prevent deposition of the encapsulation layer on the SAM covered first dielectric surface. The encapsulation can be removed from the top surface only of the embedded memory pillars, while the encapsulation on the sides of the pillars can be preserved.

Turning now to a more detailed description of aspects of the present invention, FIGS. 1 to 6 depict a process flow for a selective encapsulation of embedded memory pillar in a semiconductor device according to embodiments of the invention. In FIG. 1, embedded memory pillars 110 are shown on a semiconductor device 100. A variety of well-known fabrication operations are suitable for forming the semiconductor device 100 to the stage shown in FIG. 1. Accordingly, in the interest of brevity, such well-known fabrication operations are either omitted or described and illustrated at a high level. The embedded memory pillars 110 can include magneto tunneling junctions (MTJs). The semiconductor device 100 includes several layers of dielectric materials including a first outer dielectric layer 120, a first cap dielectric layer 130, an insulating low k dielectric layer 140, a second cap dielectric layer 150, and a second outer dielectric layer 160. The first outer dielectric layer 120 needs to be removed without damage to the second cap dielectric layer 150. The first outer dielectric layer 120 is damaged. Also present in the semiconductor device of FIG. 1 are MRAM 170 and logic 180.

Figure 2:
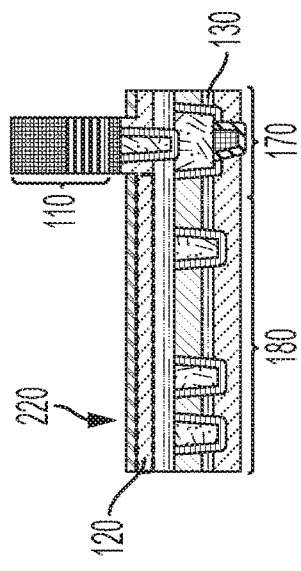
FIG. 2 depicts the semiconductor device of FIG. 1 after application of a passivation layer according to embodiments of the invention.

In FIG. 2, a passivation layer 220 has been coated onto a first surface of the first outer dielectric layer 120. The passivation layer 220 adheres to the first surface of the first outer dielectric layer 120 selective to metal on memory pillars 110. The passivation layer 220 can include a self-assembled monolayer. The self-assembled mono-layer can include alkylsilanes, aryl silanes, or a combination including at least one of the foregoing. The alkylsilanes can include chlorosilanes, bromosilanes, iodosilanes, alkoxy silanes or a combination including at least one of the foregoing. Passivation layer 220 can have a thickness ranging of about 1 nanometer (nm) to about 20 nm. As shown in FIG. 2, a portion of the passivation layer 220 can cover a portion of the second cap dielectric layer 150. The self-assembled mono-layer can be tuned to enable binding to only the dielectric surface and to the embedded memory pillars 110.

The first outer dielectric layer 120 can include a silicon oxide, a silicon nitride, a carbon doped oxide, nitrogen and hydrogen doped silicon carbide (SiCN(H)), low k dielectric (SiCOH), or a combination including at least one of the foregoing. A thickness of this layer can be 10 nm to 100 nm.

Figure 3:
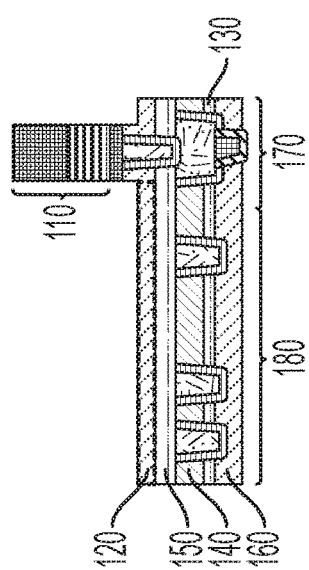
FIG. 3 depicts the semiconductor device of FIG. 2 after deposition of an encapsulation layer according to embodiments of the invention.

In FIG. 3, an encapsulation layer 230 has been applied on side and top surfaces of the embedded memory pillars 110. The passivation layer 220 is configured to prevent deposition of the encapsulation layer 230 on the first outer dielectric layer 120. The encapsulation layer 230 can have a thickness of 10 to100 nm and includes silicon nitride, silicon carbon nitride, nitrogen and hydrogen doped silicon carbide (SiCN(H)), or a combination including at least one of the foregoing. The encapsulation layer 230 is deposited using Atomic Layer Deposition (ALD), Chemical Vapor Deposition (CVD) or Plasma Enhanced Chemical Vapor Deposition (PECVD) process.

Figure 4:
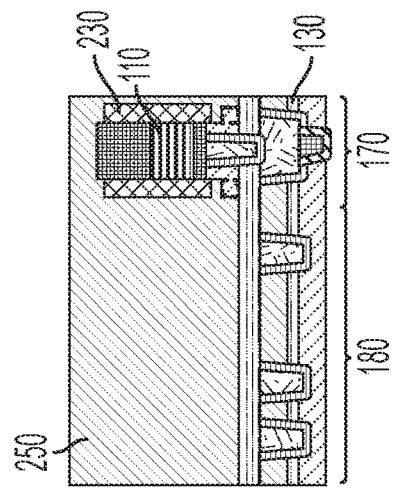
FIG. 4 depicts the semiconductor device of FIG. 3 after removal of the passivation layer according to embodiments of the invention.
Figure 5:
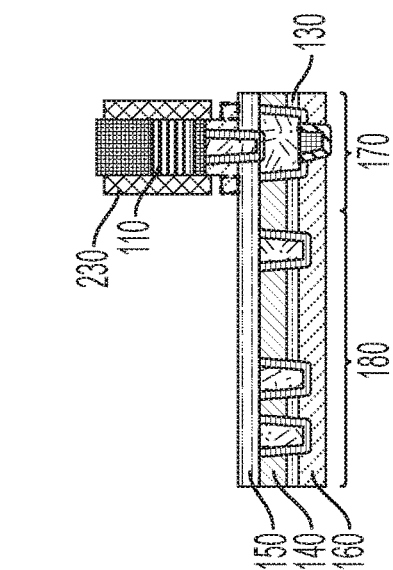
FIG. 5 depicts the semiconductor device of FIG. 4 after etching portions of the dielectric and encapsulation layers according to embodiments of the invention.

A standard plasma etch process using $N_2/H_2$ chemistry is used to remove the passivation layer 220 from the first outer layer dielectric 120 as shown in FIG. 4, thereby exposing the first outer layer dielectric 120. Turning to FIG. 5, anisotropic plasma etching of encapsulation using fluorocarbon chemistry (containing one or more gases such as including, but not limited to, $CF_4$, $CHF_3$, $CH_2F_2$, $C_4F_6$, $C_4F_8$ etc.) is performed to etch the first outer layer dielectric 120 from the semiconductor device 100 and top portions 240 of the encapsulation layer 230 around embedded memory pillars 110. The etching process can be controlled by endpoint using time resolved optical emission signals to consistently stop on the second cap dielectric layer 150, which was exposed in the etching process. The first and second cap dielectric layers 130, 150 can include a silicon carbide, nitrogen doped silicon carbide, nitrogen and hydrogen doped silicon carbide, or a combination including at least one of the foregoing. A thickness of layer the first and second cap dielectric layers 130, 150 can be 10 to 100 nm.

Figure 6:
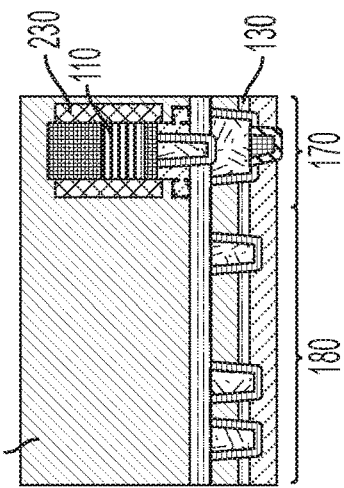
FIG. 6 depicts the semiconductor device of FIG. 5 after deposition of an insulating layer according to embodiments of the invention.

As shown in FIG. 6, a second insulating dielectric layer 250 is deposited after exposing the second low k dielectric layer (e.g. carbon or hydrogen doped silicon oxide). The process shown in FIGS. 1-6 with the selective encapsulation eliminates the need of using a dielectric etch that is highly selective to the encapsulation material 230 since both the first outer dielectric layer 120 and top of the encapsulation layer 240 having comparable thickness is removed using a single etch process. It also eliminates the need of restricting the choice of the material for the first outer dielectric layer 120 to achieve high etch selectivity to encapsulation material 230. On the contrary, a conventional scheme with non-selective encapsulation process where encapsulation material covers both embedded memory pillar and first dielectric layer requires removal of both encapsulation material and dielectric layer from horizontal surface while only removing top of the encapsulation layer. Since the combined thickness of encapsulation material and dielectric layer on horizontal surface is much greater than the thickness of encapsulation layer, excessive recessing of encapsulation material on the pillar sidewall is inevitable even with a highly selective process.

The methods allow for the formation of a semiconductor substrate that includes a substrate, at least two dielectric layers on the substrate; and embedded memory pillars disposed on one of the dielectric layers. The embedded memory pillars include an encapsulation layer on at least two sides of the embedded memory pillars.

Notwithstanding the above, the following materials are contemplated for use in embodiments of the invention. The various dielectric layers can be formed from a Si-based oxide/nitride and can include other elements such as C, N, O, and the like. Low-k dielectric generally refers to a k value of less than about 4. The embedded memory pillars can be formed from Nb, NbN, W, WN, Ta, TaN, Ti, TiN, Ru, Mo, Cr, V, Pd, Pt, Rh, Sc, Al and other high melting point metals or conductive metal nitrides.

Figure 7:
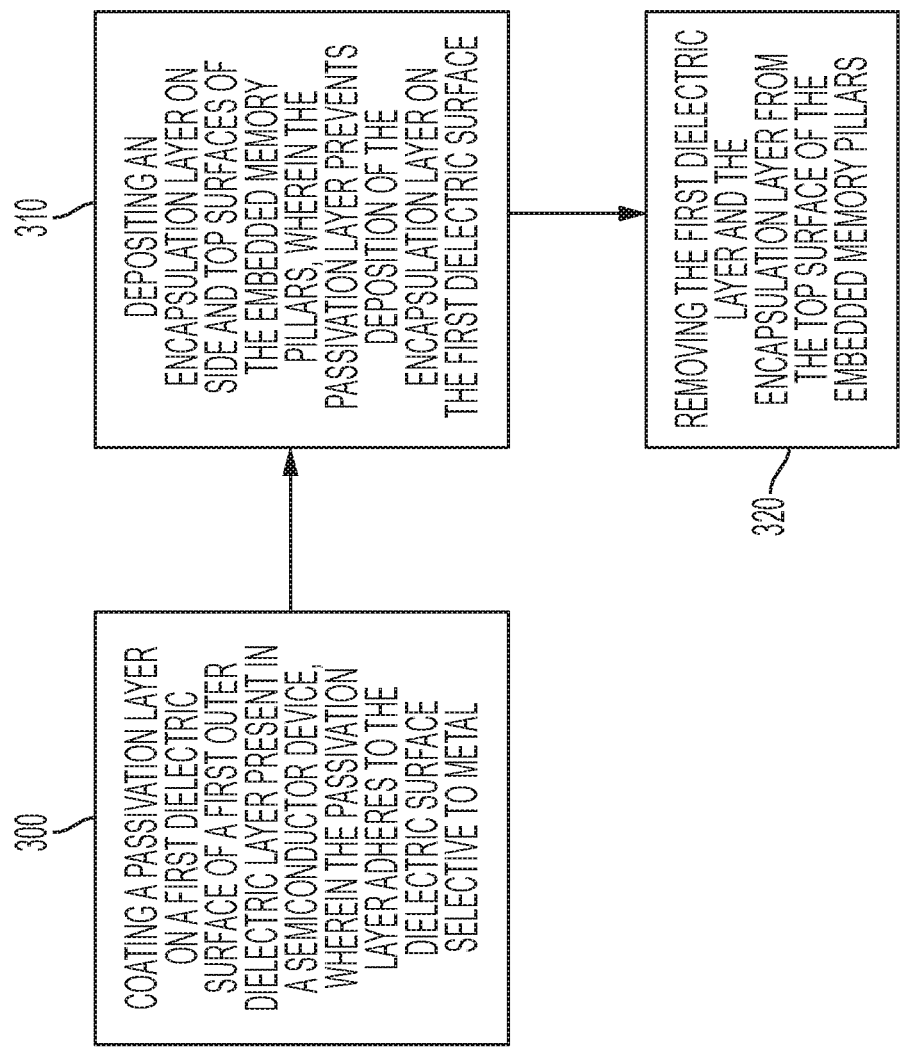
FIG. 7 depicts a flow diagram illustrating a method according to one or more embodiments of the invention.

In FIG. 7, a passivation layer is coated on a first dielectric surface of a first outer dielectric layer present in a semiconductor device at 300. The passivation layer adheres to the dielectric surface selective to metal. At 310, an encapsulation layer is applied on side and top surfaces of the embedded memory pillars. The passivation layer prevents deposition of the encapsulation layer on the first dielectric surface. At 320, the first dielectric layer and the encapsulation layer are removed from the top surface of the embedded memory pillars.

The methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of selectively encapsulating embedded memory pillars in a semiconductor device, the method comprising:
   forming embedded memory pillars over a substrate;
   coating a passivation layer on a first dielectric surface of a first outer dielectric layer present in the semiconductor device such that side and top surfaces of the embedded memory pillars remain exposed, wherein the passivation layer adheres to the first dielectric surface selective to metal;
   depositing an encapsulation layer directly on the exposed side and top surfaces of the embedded memory pillars and on a top surface of the passivation layer, wherein the passivation layer prevents deposition of the encapsulation layer on the first dielectric surface of the first outer layer dielectric;
   removing the passivation layer to define a cavity between the first outer dielectric layer and the encapsulation layer; and
   removing the first outer dielectric layer from horizontal surfaces around the embedded memory pillar and the encapsulation layer from the top surface of the embedded memory pillars.

2. The method of claim 1, wherein the passivation layer comprises a self-assembled monolayer.

3. The method of claim 2, wherein the self-assembled monolayer comprises alkylsilanes, aryl silanes, or a combination comprising at least one of the foregoing.

4. The method of claim 3, wherein the alkylsilanes comprise chlorosilanes, alkoxy silanes, or combination comprising at least one of the foregoing.

5. The method of claim 1, wherein the first outer layer dielectric comprises a silicon oxide, a silicon nitride, a carbon doped oxide, nitrogen and hydrogen doped silicon carbide, low k dielectric, or a combination comprising at least one of the foregoing.

6. The method of claim 1, wherein the encapsulation layer comprises silicon nitride, silicon carbon nitride, nitrogen and hydrogen doped silicon carbide, or a combination comprising at least one of the foregoing.

7. The method of claim 6, wherein the encapsulation layer comprises silicon nitride.

8. The method of claim 1, wherein the embedded memory pillars comprise magneto tunneling junctions.

9. The method of claim 1, wherein a top portion of the embedded memory pillars remains uncovered by the encapsulation layer after etching.

10. The method of claim 1, further comprising etching the passivation layer from the first outer dielectric layer after the encapsulation layer has been applied, thereby exposing the first outer dielectric layer.

* * * * *